US 11,490,553 B2

(12) United States Patent
Ishikawa

(10) Patent No.: US 11,490,553 B2
(45) Date of Patent: Nov. 1, 2022

(54) COMPONENT MOUNTING SYSTEM AND COMPONENT GRASPING METHOD

(71) Applicant: FUJI CORPORATION, Chiryu (JP)

(72) Inventor: Kazuma Ishikawa, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/971,008

(22) PCT Filed: Feb. 21, 2018

(86) PCT No.: PCT/JP2018/006189
§ 371 (c)(1),
(2) Date: Aug. 19, 2020

(87) PCT Pub. No.: WO2019/163018
PCT Pub. Date: Aug. 29, 2019

(65) Prior Publication Data
US 2020/0404820 A1    Dec. 24, 2020

(51) Int. Cl.
*B23P 19/04* (2006.01)
*H05K 13/04* (2006.01)
*H05K 13/08* (2006.01)
*H05K 13/00* (2006.01)

(52) U.S. Cl.
CPC ..... *H05K 13/0812* (2018.08); *H05K 13/0069* (2013.01)

(58) Field of Classification Search
CPC ............ H05K 13/0069; H05K 13/028; H05K 13/043; H05K 13/0812
See application file for complete search history.

(56) References Cited

U.S. PATENT DOCUMENTS

| 11,140,801 | B2 * | 10/2021 | Oyama | H05K 13/0452 |
| 2008/0082213 | A1 | 4/2008 | Ban et al. | |
| 2013/0238124 | A1 | 9/2013 | Suzuki et al. | |
| 2018/0035581 | A1 * | 2/2018 | Matsumoto | H05K 13/028 |
| 2020/0275590 | A1 * | 8/2020 | Nakayama | H05K 13/0813 |

FOREIGN PATENT DOCUMENTS

| JP | 63-163975 A | 7/1988 |
| JP | 2008-87074 A | 4/2008 |
| JP | 2010-228819 A | 10/2010 |
| JP | 2013-184279 A | 9/2013 |
| JP | WO2016/046897 A1 | 3/2016 |
| JP | 2016-219472 A | 12/2016 |
| JP | 2017-168712 A | 9/2017 |
| JP | WO2017/208325 A1 | 12/2017 |

OTHER PUBLICATIONS

International Search Report dated Apr. 24, 2018 in PCT/JP2018/006189 filed on Feb. 21, 2018, 2 pages.

* cited by examiner

*Primary Examiner* — Paul D Kim
(74) *Attorney, Agent, or Firm* — Oblon, McClelland, Maier & Neustadt, L.L.P.

(57) ABSTRACT

A component mounting system comprising: a stage configured to scatter components; a holding tool configured to move over the stage and hold components from the stage; a storage device configured to store positional information of components on the stage that the holding tool failed to hold; and a control device configured to control the operation of the holding tool so that components are held while excluding components in the positional information stored in the storage device from becoming holding targets.

8 Claims, 13 Drawing Sheets

COMPONENT MOUNTING SYSTEM AND COMPONENT GRASPING METHOD

TECHNICAL FIELD

The present application relates to a component mounting system having a stage on which components are scattered.

BACKGROUND ART

As described in the following Patent Literature, there is a component mounting system that supplies components on a stage in a scattered manner.

PATENT LITERATURE

Patent Literature 1: WO 2016/046897

BRIEF SUMMARY

Technical Problem

It is an object of the present disclosure to properly supply components on a stage.

Solution to Problem

In order to solve the above problem, the present specification discloses a component mounting system comprising: a stage configured to scatter components; a holding tool configured to move on the stage and hold components that are on the stage; a storage device configured to store positional information of components on the stage that the holding tool failed to hold; and a control device configured to control an operation of the holding tool so that the holding tool holds the components by excluding components in positional information stored in the storage device from being holding targets.

In order to solve the above problem, the present specification discloses a component holding method for holding a component from a stage on which components are scattered by way of a holding tool moving over the stage, the component holding method having: a storing step for storing positional information of components on the stage which the holding tool failed to hold, and a control step for controlling the operation of the holding tool so as to hold the component while excluding components in the positional information stored in the storing step from becoming holding targets.

Advantageous Effects

According to the present disclosure, if holding of a component fails when components scattered on a stage are held by a holding tool, positional information regarding the position of the component on the stage is stored. Components that are scattered at positions corresponding to positional information are excluded from becoming holding target components. As a result, it is possible to prohibit holding of a component for which there was a failure in being held by the holding tool, that is, a component that the holding tool has difficulty holding, thereby ensuring an adequate supply of components on the stage.

DESCRIPTION OF EMBODIMENTS

Hereinafter, an embodiment of the present disclosure will be described in detail with reference to the drawings.

(A) Configuration of the Component Mounting Machine

Figure 1:
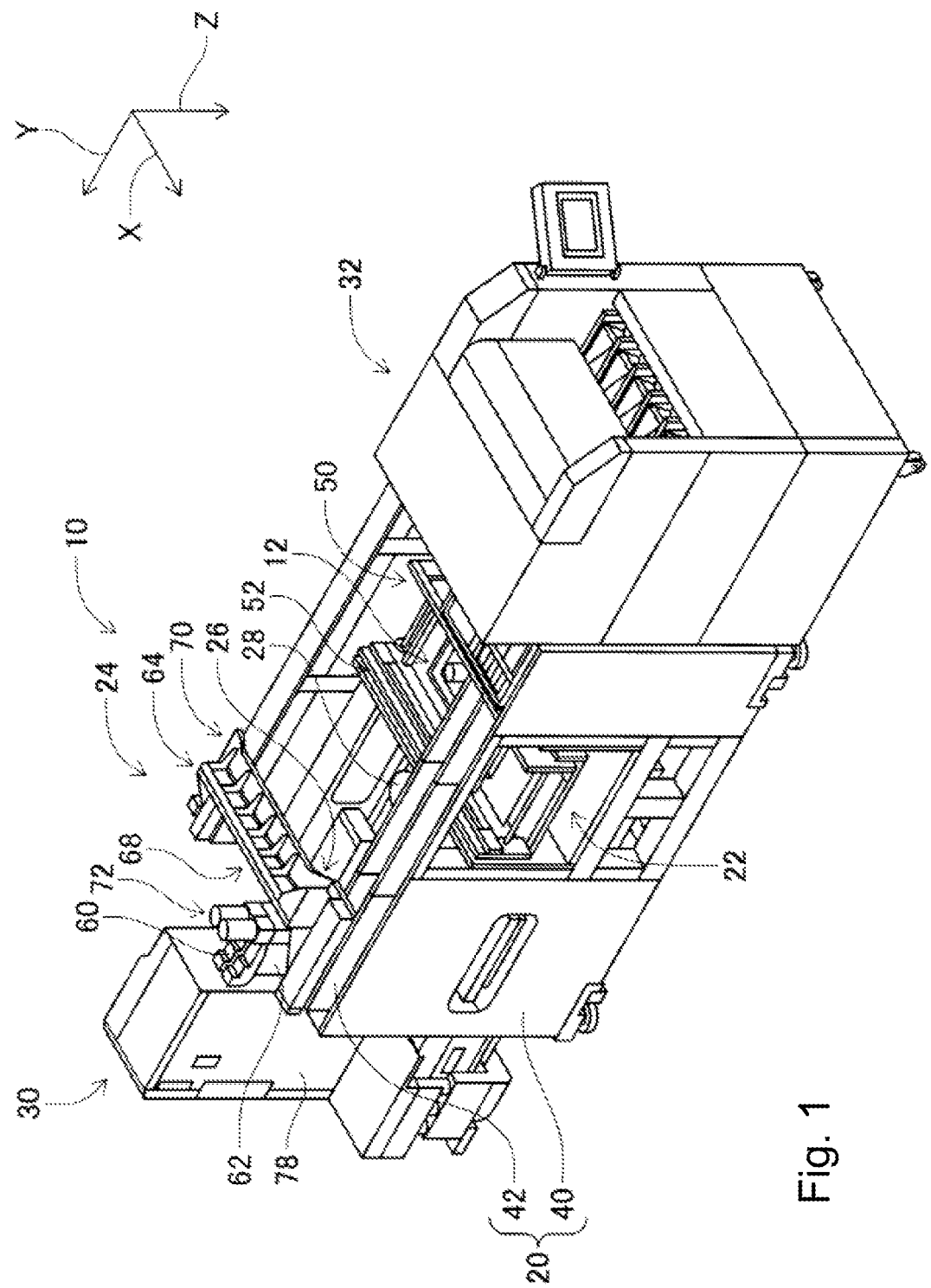
FIG. 1 A perspective view showing a component mounting machine.

FIG. 1 shows component mounting machine 10. Component mounting machine 10 is a device for performing the work of mounting components on circuit substrate 12. Component mounting machine 10 includes device main body 20, substrate conveyance and holding device 22, component mounting device 24, imaging devices 26, 28, component supply device 30, bulk component supply device 32, and control device (refer to FIG. 12) 34. Incidentally, a circuit board or a substrate of a three-dimensional structure are examples of circuit substrate 12, and a printed wiring board and a printed circuit board are examples of a circuit board.

Device main body 20 is constituted by frame section 40 and beam section 42 which is installed on frame section 40. Substrate conveyance and holding device 22 is provided at the center in the front-rear direction of frame section 40, and is comprised of conveyance device 50 and the clamping device 52. Conveyance device 50 is a device for conveying circuit substrate 12, and clamping device 52 is a device for holding circuit substrate 12. Being configured as described above, substrate conveyance and holding device 22 conveys circuit substrate 12 and fixedly holds circuit substrate 12 in a predetermined position. In the following description, the conveyance direction of circuit board 12 is referred to as the X-direction, the horizontal direction perpendicular to the X-direction is referred to as the Y-direction, and the vertical direction is referred to as the Z-direction. In other words, the width direction of component mounting machine 10 is the X-direction, and the front-rear direction is the Y-direction.

Figure 2:
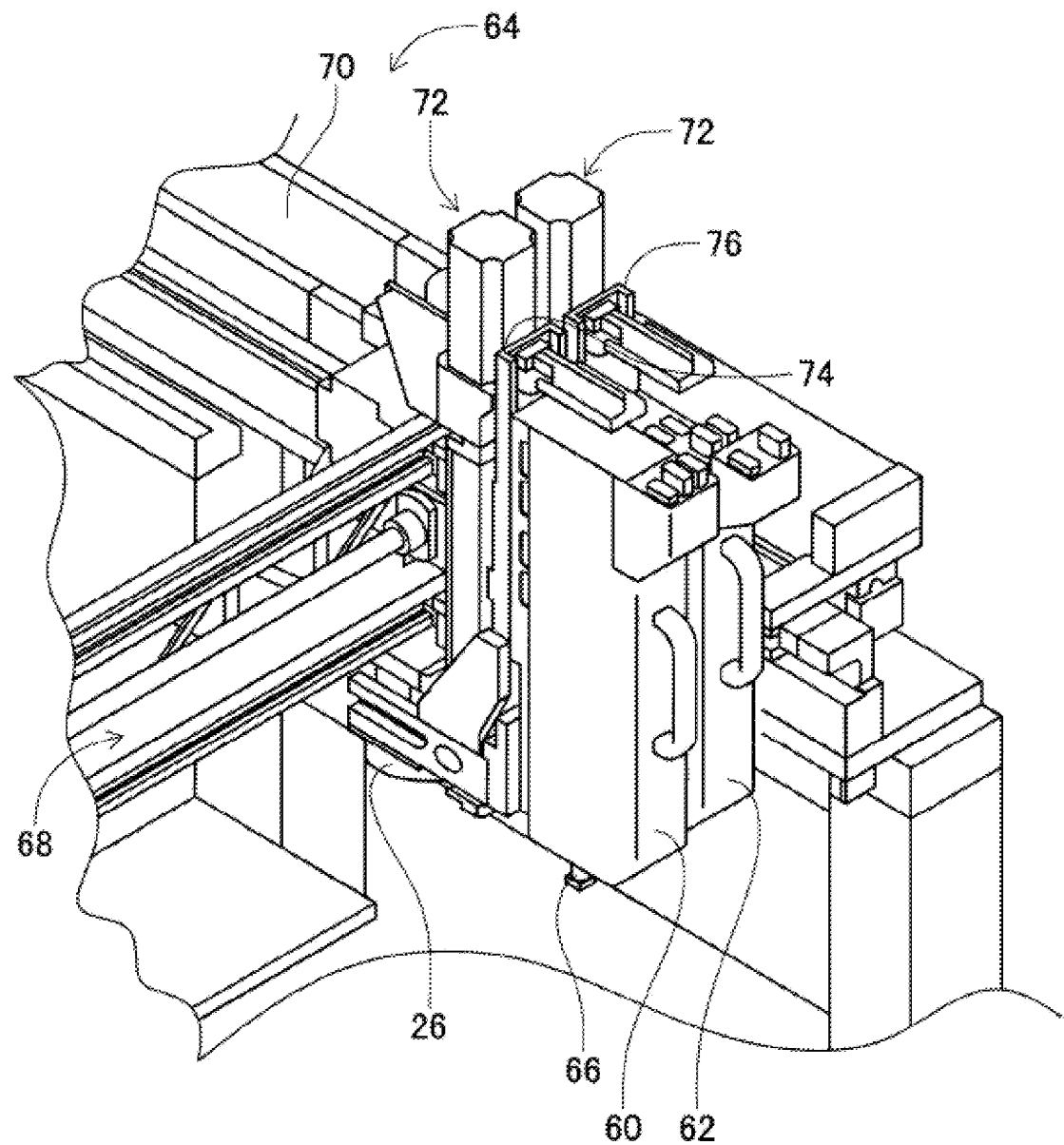
FIG. 2 A perspective view showing a component mounting device of the component mounting machine.

Component mounting device 24 is disposed on beam section 42 and has two work heads 60, 62 and work head moving device 64. Work heads 60, 62 each have suction nozzle (refer to FIG. 2) 66 and holds a component with suction nozzle 66. Further, work head moving device 64 has X-direction moving device 68, Y-direction moving device 70, and Z-direction moving device 72. Two work heads 60, 62 are then moved together to an arbitrary position on frame section 40 by X-direction moving device 68 and Y-direction moving device 70. As shown in FIG. 2, work heads 60, 62 are detachably mounted on sliders 74, 76, and Z-direction moving device 72 moves sliders 74, 76 individually in the up-down direction. In other words, work heads 60, 62 are individually moved in the up-down direction by Z-direction moving device 72.

Imaging device 26 is attached to slider 74 while facing downward and is moved together with work head 60 in the X-direction, Y-direction, and Z-direction. Thus, imaging device 26 images an arbitrary position on frame section 40. As shown in FIG. 1, imaging camera 28 is provided between substrate conveyance and holding device 22 and component supply device 30 on frame section 40 while facing upward. With this configuration, imaging device 28 captures a component held by suction nozzle 66 of work heads 60, 62.

Component supply device 30 is disposed at one end, in the front-rear direction, of frame section 40. Component supply device 30 includes tray-type component supply device 78 and a feeder-type component supply device (not shown). Tray-type component supply device 78 constitutes a device configured to supply components placed on a tray. The feeder-type component supply device is a device for supplying components by a tape feeder (not shown) and a stick feeder (not shown).

Bulk component supply device 32 is disposed at the other end in the front-rear direction of frame section 40. Bulk component supply device 32 is a device for aligning multiple scattered components and supplying the components in an aligned state. That is, bulk component supply device 32 is a device for aligning multiple components in any orientation into a predetermined orientation and supplying components in a predetermined orientation. Hereinafter, the configuration of bulk component supply device 32 will be described in detail. Components supplied by component supply device 30 and bulk component supply device 32 may include electronic circuit components, solar cell constituent components, power module constituent components, and the like. Electronic circuit components include components with or without leads.

Figure 3:
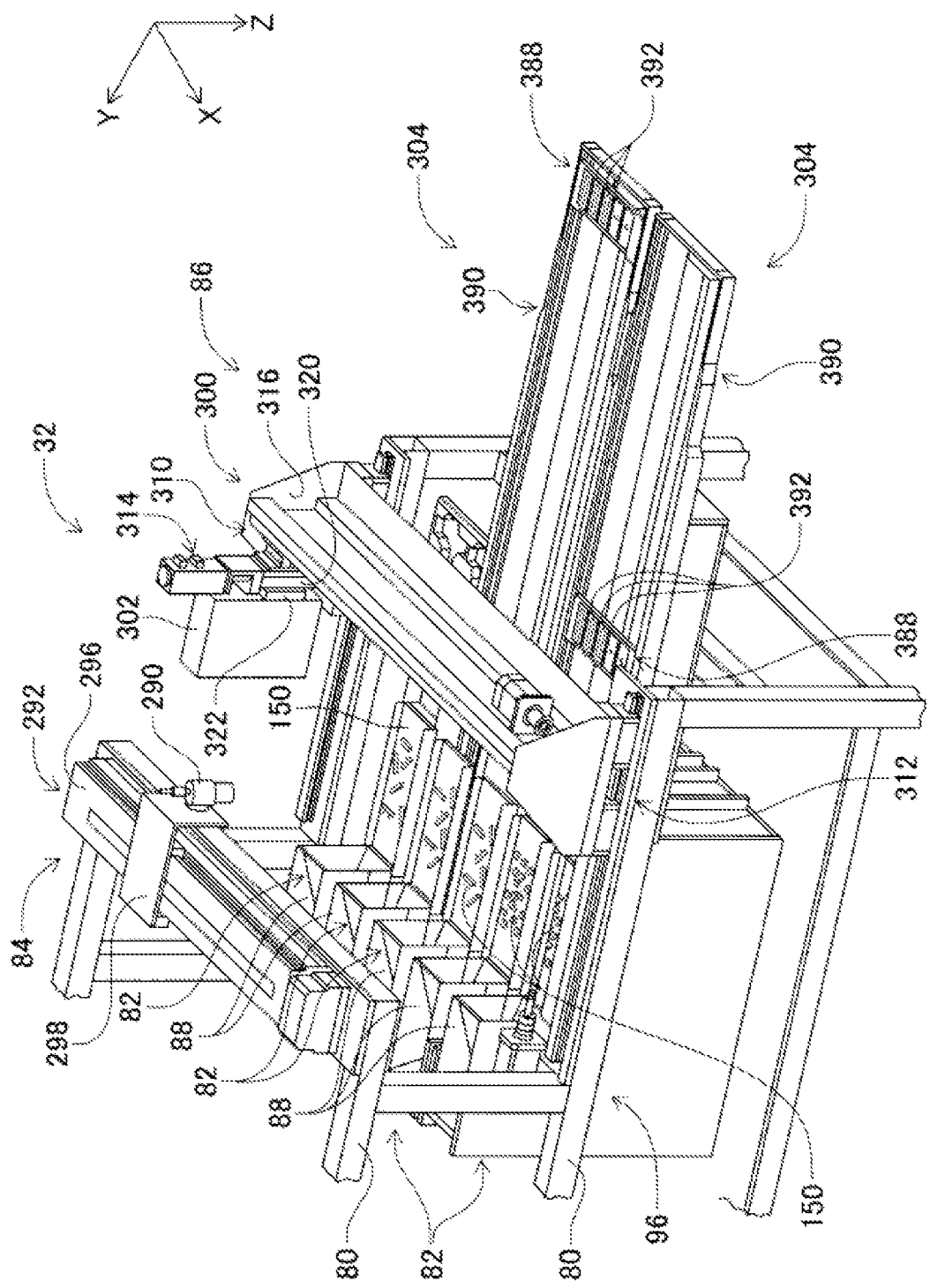
FIG. 3 A perspective view showing a bulk component supply device.

Bulk component supply device 32, as shown in FIG. 3, has main body 80, component supply unit 82, imaging device 84, and component delivery device 86.

(a) Component Supply Unit

Component supply unit 82 includes component feeder 88 and component scattering device (refer to FIG. 4) 90 and component return device (refer to FIG. 4) 92, and component feeder 88, component scattering device 90, and component return device 92 are integrally configured. Component supply unit 82 is detachably assembled to base 96 of main body 80, and in bulk component supply device 32, five component supply units 82 are arranged side by side in one row in the X-direction.

Figure 4:
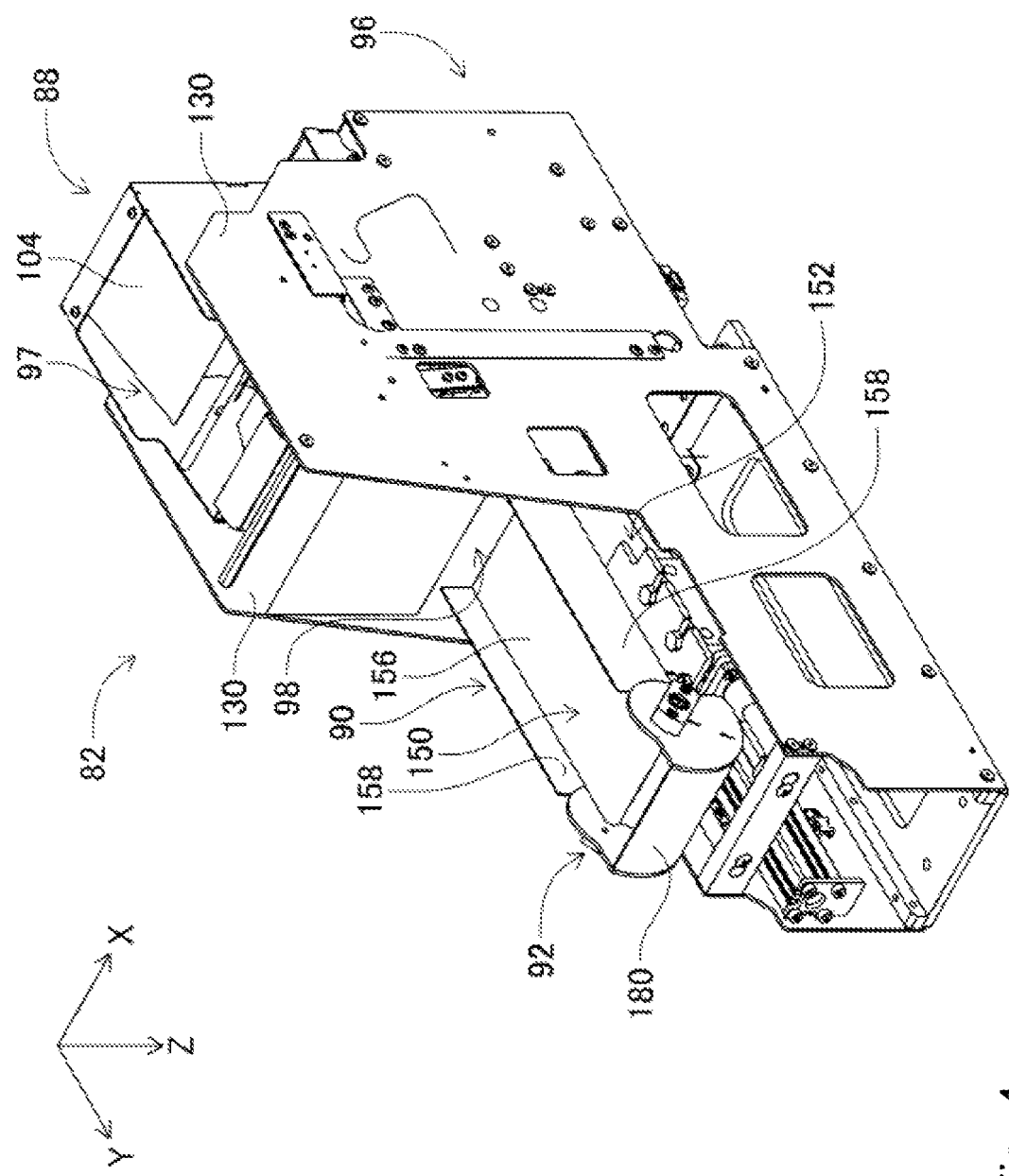
FIG. 4 A perspective view showing a component supply unit.
Figure 5:
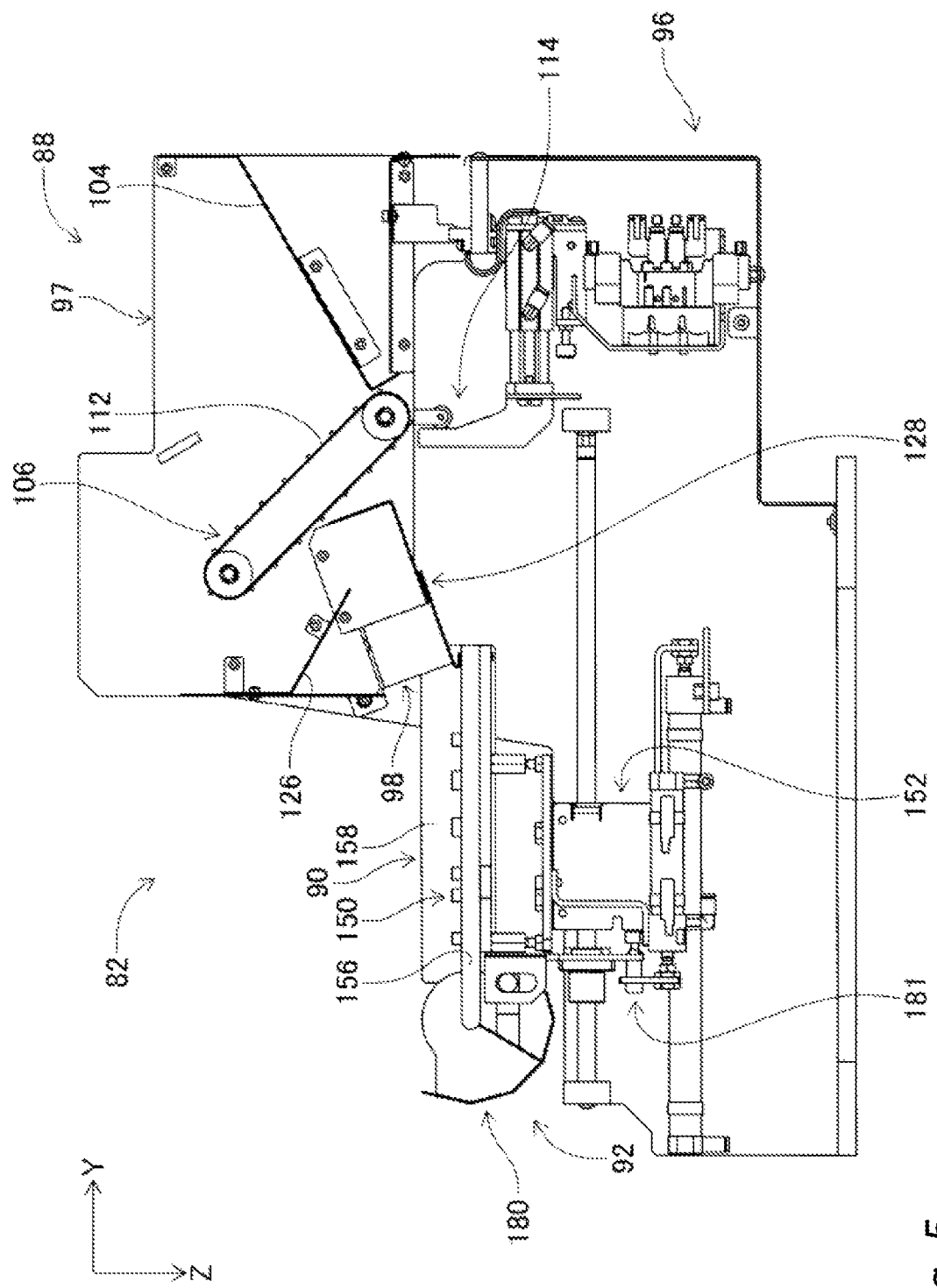
FIG. 5 A see-through view showing the component supply unit.

Component feeder 88 has a general rectangular box shape, as shown in FIGS. 4 and 5, and is disposed so as to extend in the Y-direction. The Y-direction is described as the front-rear direction of component feeder 88, and in component supply unit 82, the direction toward the side in which component return device 92 is disposed is described as forward, and the direction toward the side in which component feeder 88 is disposed is described as rearward.

Component feeder 88 is open at the top and front faces, and the opening at the top face is inlet 97 for components and the opening at the front face is discharge port 98 for components. In component feeder 88, inclined plate 104 is disposed below inlet 97. Inclined plate 104 is directed toward the center from the edge of the rear side of component feeder 88 and is disposed so as to be inclined downward.

Further, in front of inclined plate 104, as shown in FIG. 5, conveyor device 106 is disposed. Conveyor device 106 is disposed so as to be inclined upward from the front end of inclined plate 104 toward the front of component feeder 88. It should be noted that conveyor belt 112 of conveyor device 106 rotates counterclockwise in FIG. 5. That is, the conveyance direction of conveyor device 106 is obliquely upward from the front end of inclined plate 104 to the front.

Further, inclined plate 126 is disposed below the front end of conveyor device 106. Inclined plate 126 is disposed from the end face of the front side of component feeder 88 toward the lower side of conveyor device 106, with the rear end inclined obliquely downward. Furthermore, inclined plate 128 is disposed below inclined plate 126. Inclined plate 128 is inclined from below the central portion of conveyor device 106 toward discharge port 98 of component feeder 88, with the front end inclined downward.

Further, a pair of side frame portions 130 are assembled on base 96, as shown in FIG. 4. A pair of side frame portions 130 are parallel to each other and facing each other, and are erected so as to extend in the Y-direction. The distance between the pair of side frame portions 130 is slightly larger than the width of component feeder 88, and component feeder 88 is detachably installed between the pair of side frame portions 130.

Component scattering device 90 includes component support member 150 and component support member moving device 152. Component support member 150 is constituted by stage 156 and a pair of side wall sections 158. Stage 156 has a general elongated plate shape and is disposed to as to extend forward from the lower portion of component feeder 88, which is installed between the pair of side frame portions 130. The upper face of stage 156 is generally horizontal, as shown in FIG. 5, and is disposed with a slight clearance with the front end of inclined plate 128 of component feeder 88. Further, the pair of side wall portions 158, as shown in FIG. 4, are erected on both sides in the longitudinal direction of stage 156 and fixed, and the upper end of each side wall portion 158 extends above the upper face of stage 156.

Further, component support member moving device 152 slides component support member 150 in the Y-direction by the operation of air cylinder (refer to FIG. 12) 166. As this occurs, component support member 150 moves between a retracted state (refer to FIG. 6) in which component support member 150 is retracted underneath component feeder 88 and an exposed state (refer to FIG. 5) in which component support member 150 is exposed from underneath component feeder 88.

Figure 7:
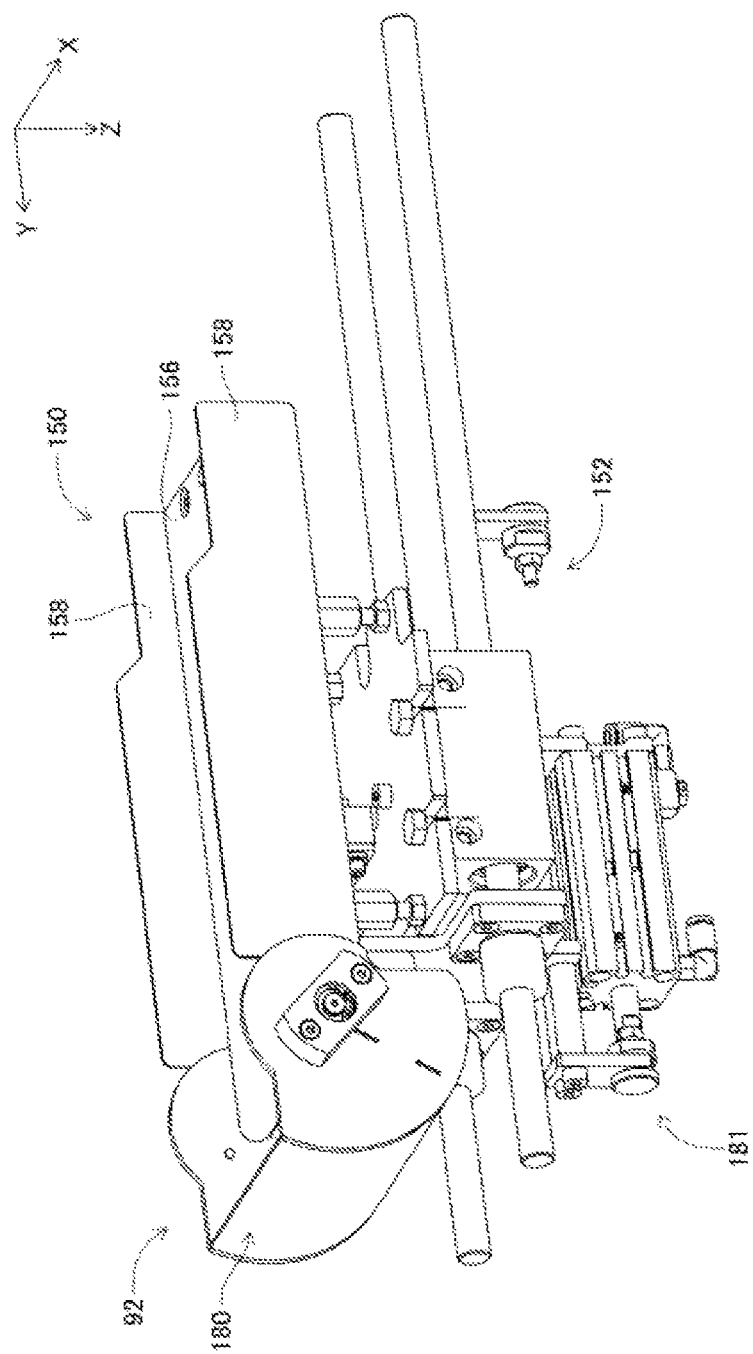
FIG. 7 A perspective view showing a component scattering device.
Figure 8:
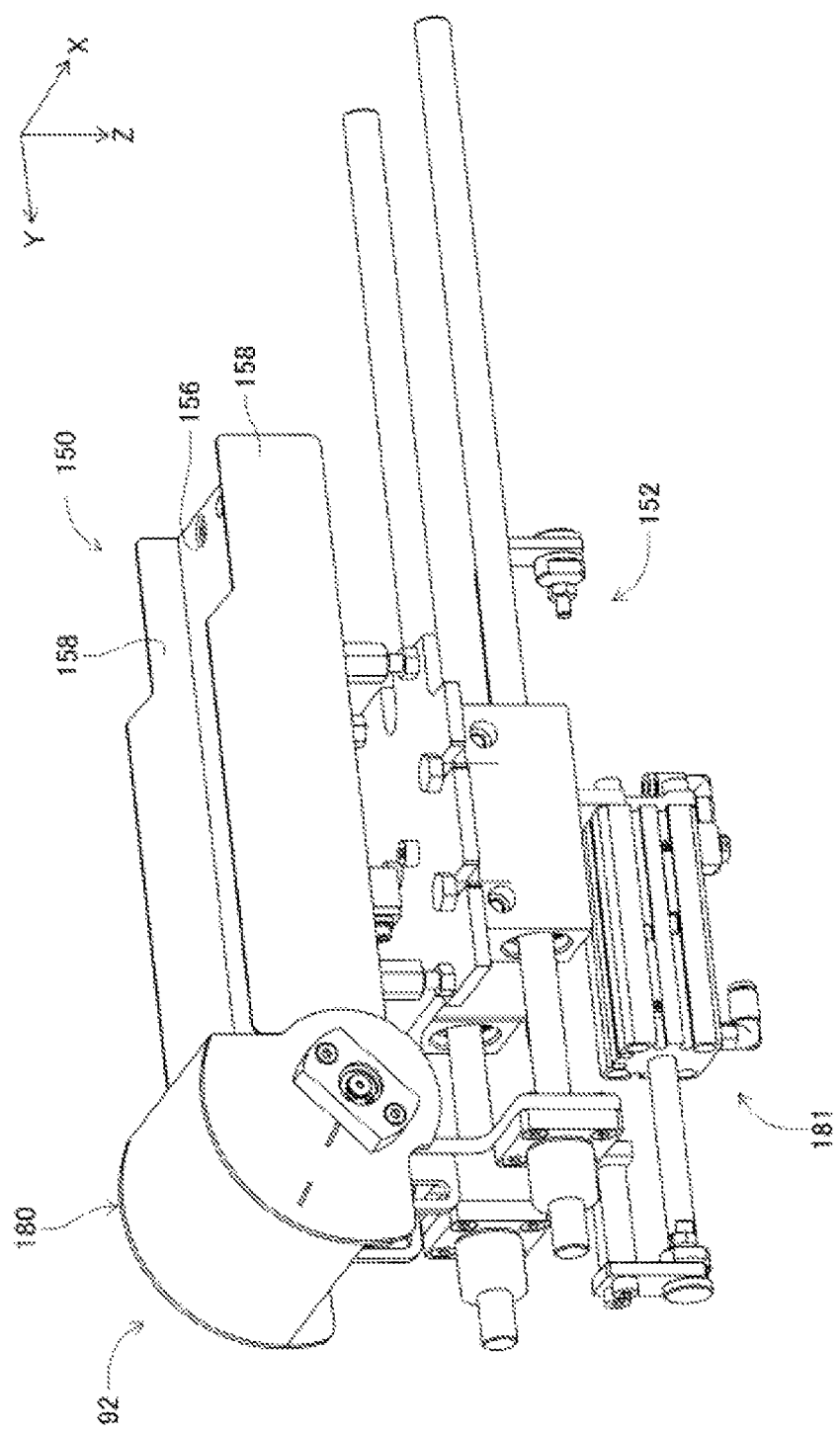
FIG. 8 A perspective view showing the component scattering device.

As shown in FIG. 7, component return device 92 includes component accommodating container 180 and container swing device 181. Component accommodating container 180 has a general box-like shape, and the bottom surface thereof has an arc shape. Component accommodating container 180 is swingably held at the front end of stage 156 of component supporting member 150 and swings by the operation of container swing device 181. Here, component accommodating container 180 swings between an accommodating orientation with the opening directed upward (refer to FIG. 7) and a returning orientation with the opening directed toward the upper face of stage 156 of component support member 150 (refer to FIG. 8).

(b) Imaging Device

Imaging device 84, as shown in FIG. 3, includes camera 290 and camera moving device 292. Camera moving device 292 includes guide rail 296 and slider 298. Guide rail 296 is secured to main body 80, above component feeder 88, so as to extend in the width direction (X-direction) of bulk component supply device 32. Slider 298 is slidably attached to guide rail 296 and slides to any position by actuation of electromagnetic motor (refer to FIG. 12) 299. In addition, camera 290, facing downward, is attached to slider 298.

(c) Component Delivery Device

Component delivery device 86 includes component holding head moving device 300, component holding head 302, and two shuttle devices 304, as shown in FIG. 3.

Component holding head moving device 300 includes X-direction moving device 310, Y-direction moving device 312, and Z-direction moving device 314. Y-direction moving device 312 has Y-slider 316 extending in the X-direction above component supply unit 82, and Y-slider 316 moves to any position along the Y-direction by the driving of electromagnetic motor (refer to FIG. 12) 319. X-direction moving device 310 has X-slider 320 disposed on a side face of Y-slider 316, and X-slider 320 moves to any position along the X-direction by the driving of electromagnetic motor (refer to FIG. 12) 321. Z-direction moving device 314 has Z-slider 322 disposed on a side surface of X-slider 320, and Z-slider 322 moves to any position along the Z-direction by the driving of electromagnetic motor (refer to FIG. 12) 323.

Figure 9:
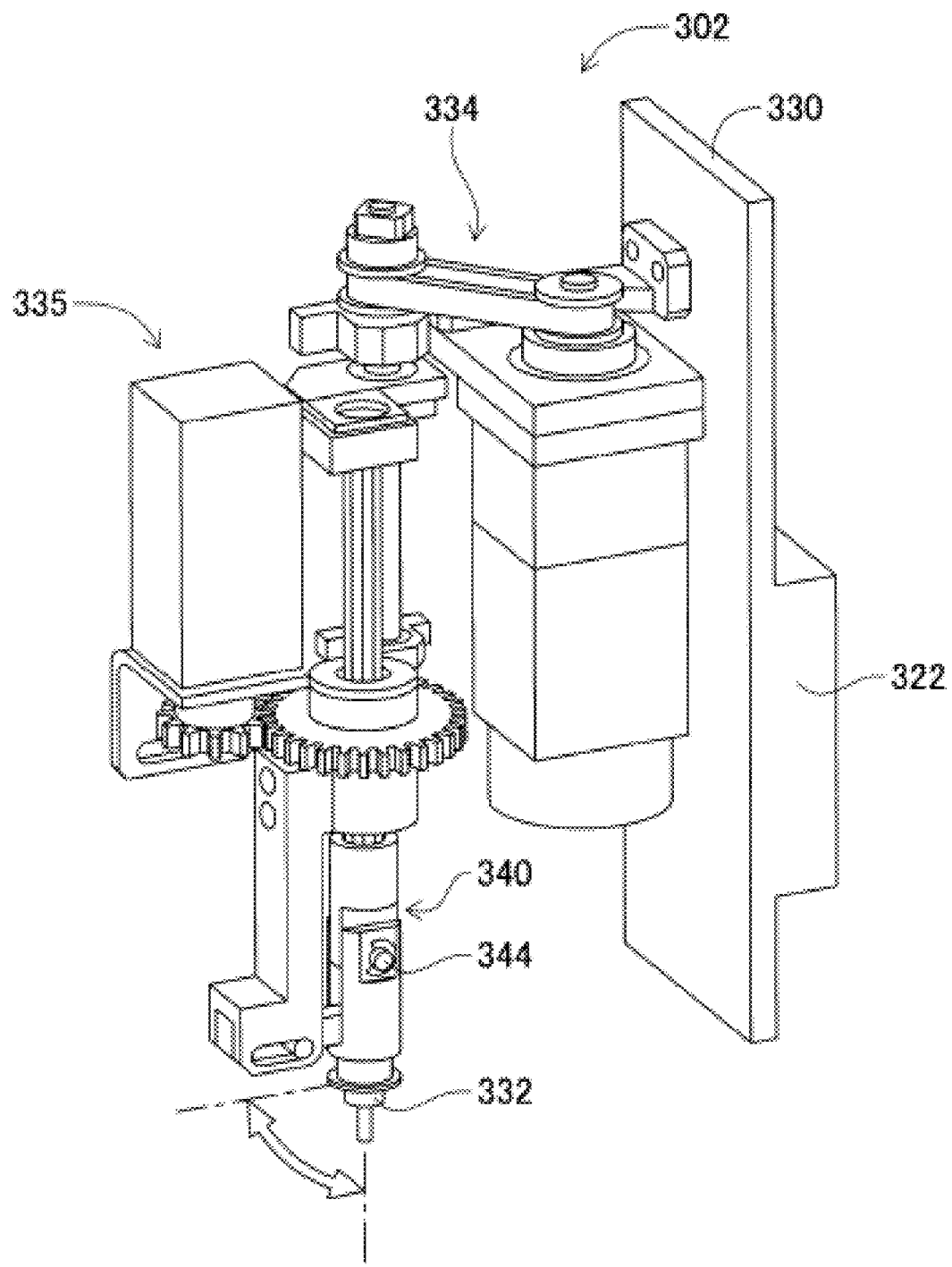
FIG. 9 A perspective view showing a component holding head.

Component holding head 302 includes head main body 330, suction nozzle 332, nozzle pivoting device 334, and nozzle rotation device 335, as shown in FIG. 9. Head main body 330 is formed integrally with Z-slider 322. Suction nozzle 332 holds components by air suction and is detachably attached to the lower end of holder 340. Holder 340 is bendable at support shaft 344, and the operation of nozzle pivoting device 334 causes holder 340 to bend 90 degrees upward. With this configuration, suction nozzle 332 attached to the lower end of holder 340 is pivoted 90 degrees and positioned in the pivoted position. That is, suction nozzle 332 is pivoted between a non-pivoted position and a pivoted position by the operation of nozzle pivoting device 334. Of course, it is also possible to stop at a set angle between the non-pivoted position and the pivoted position. Nozzle rotation device 335 also rotates suction nozzle 332 about its axis.

Component holding head 302 has pressure sensor (refer to FIG. 12) 336, and the suction pressure of air by suction nozzle 332 is measured with pressure sensor 336. With this, the adequacy of the suction of components with suction nozzle 332 is detected. More specifically, after a component is picked up by suction nozzle 332, if the value detected by pressure sensor 336, that is, the suction pressure of air by suction nozzle 332 reaches a predetermined pressure, the component is properly picked up and held by suction nozzle 332. On the other hand, if the value detected by pressure sensor 336, that is, the suction pressure of air by suction nozzle 332, does not reach the predetermined pressure after the component is picked up by suction nozzle 332, the component is not properly picked up and held by suction nozzle 332. As described above, in component holding head 302, the adequacy of the suction of components with suction nozzle 332 is detected.

Figure 10:
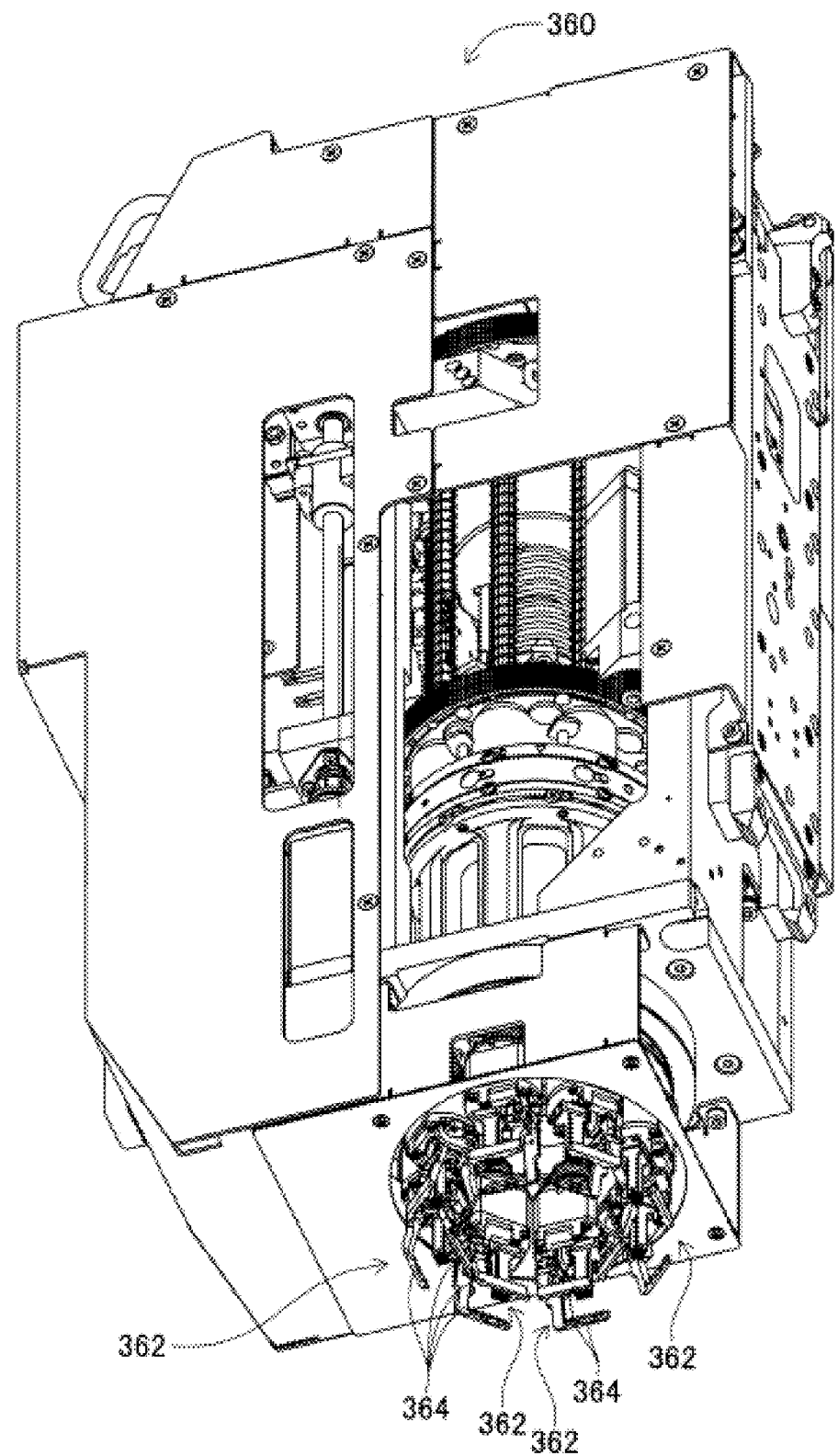
FIG. 10 A perspective view showing a second component holding head.

Further, component delivery device 86, as shown in FIG. 10, has component holding head 360, having a structure different from component holding head 302, detachably attached to Z-slider 322 in place of component holding head 302. Component holding head 360 has eight chucks 362, and each of these eight chucks 362 grip components by bringing together and separating a pair of gripping claws 364. Eight chucks 362 are detachable with respect to component holding head 360, and it is also possible to attach suction nozzles 332 instead of chucks 362. That is, it is possible to attach any combination of eight suction nozzles 332 and chucks 362 to component holding head 360.

Each of two shuttle devices 304 also includes component carrier 388 and component carrier moving device 390 as shown in FIG. 3 and are arranged side by side at the front of component supply unit 82 and secured to main body 80. Component carrier 388 includes five component receiving members 392 which are arranged side by side in a row in the lateral direction, and components are placed individually in component receiving members 392.

Figure 11:
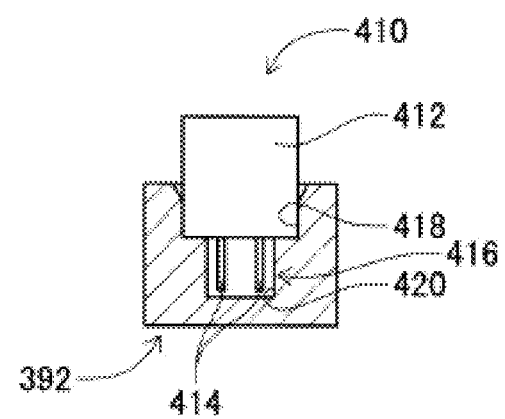
FIG. 11 A view showing a component receiving member in a state in which an electronic circuit component is accommodated.

Bulk component supply device 32 can supply various types of components, and, hence, various types of component receiving members 392 are prepared so as to receive components of various configurations. Here, as an electronic circuit component supplied by bulk component supply device 32, as shown in FIG. 11, component receiving member 392 corresponding to lead component 410 having leads will be described. Lead component 410 consists of a block-shaped component body 412 and two leads 414 protruding from the bottom face of component body 412.

Component receiving member 392 has component receiving recessed section 416 having a shape corresponding to lead component 410. Component receiving recessed section 416 is a stepped-shaped recess and is composed of a main body receiving recessed section 418, which opens to the upper face of component receiving member 392, and lead receiving recessed section 420, which opens to the bottom surface of main body receiving recessed section 418. Lead component 410 is inserted into component receiving recessed section 416 with leads 414 facing downward. As a result, lead component 410 is placed inside component receiving recessed section 416 in a state in which leads 414 are inserted into lead receiving recessed section 420 and component body 412 is inserted into main body receiving recessed section 418.

Further, component carrier moving device 390, as shown in FIG. 3, is a plate-shaped elongated member disposed at the front of component supply unit 82 so as to extend in the front-rear direction. On the upper face of component carrier moving device 390, component carrier 388 is slidably disposed in the front-rear direction, and slides to any position in the front-rear direction by the driving of electromagnetic motor (refer to FIG. 12) 430. Incidentally, when component carrier 388 slides in a direction approaching component supply unit 82, component carrier 388 slides up to the component receiving position located within the range in which component holding head 302 is movable by component holding head moving device 300. On the other hand, when component carrier 388 slides in a direction away from component supply unit 82, component carrier 388 slides up to the component supply position located within the range in which work heads 60, 62 is movable by work head moving device 64.

Figure 12:
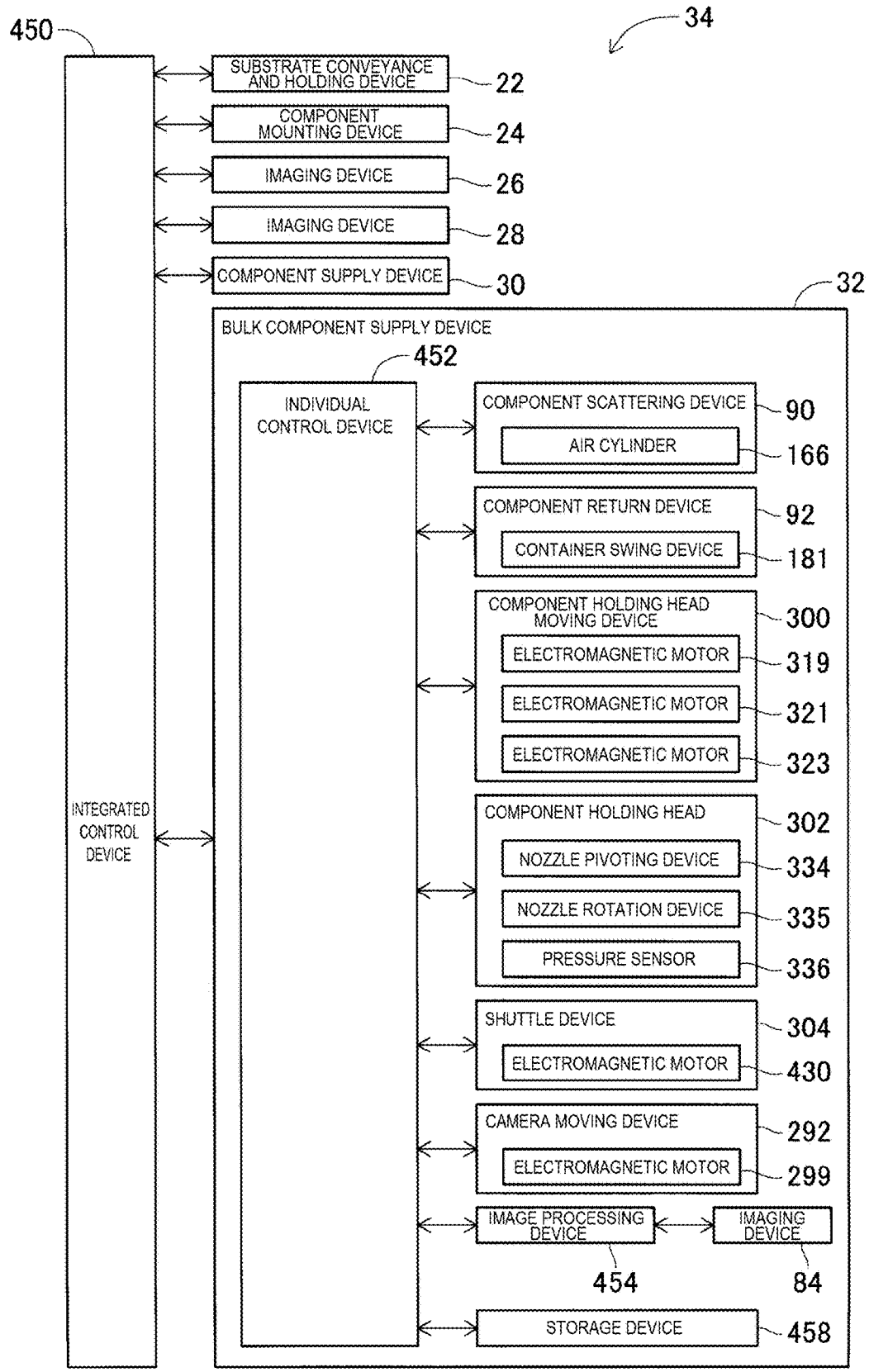
FIG. 12 A block diagram showing a control device of the component mounting machine.

Further, control device 34 includes, as shown in FIG. 12, integrated control device 450, multiple individual control devices (only one is shown in the FIG. 452, and image processing device 454. Integrated control device 450 is made up mainly of a computer and is connected to substrate conveyance and holding device 22, component mounting device 24, imaging device 26, imaging device 28, component supply device 30, and bulk component supply device 32. With this configuration, integrated control device 450 controls substrate conveyance and holding device 22, component mounting device 24, imaging device 26, imaging device 28, component supply device 30, and bulk component supply device 32 in an integrated manner. Multiple individual control devices 452 are each made up mainly of a computer and are provided separately for substrate conveyance and holding device 22, component mounting device 24, imaging device 26, imaging device 28, component supply device 30, and bulk component supply device 32 (in the figure, only individual control device 452 for bulk component supply device 32 is shown).

Individual control device 452 for bulk component supply device 32 is connected to component scattering device 90, component return device 92, camera moving device 292, component holding head moving device 300, component holding head 302, and shuttle device 304. With this configuration, individual control device 452 of bulk component supply device 32 controls component scattering device 90, component return device 92, camera moving device 292, component holding head moving device 300, component holding head 302, and shuttle device 304. Further, image processing device 454 is connected to imaging device 84 and processes imaging data captured by imaging device 84. Image processing device 454 is connected to individual control device 452 of bulk component supply device 32. Thus, individual control device 452 of bulk component supply device 32 acquires imaging data captured by imaging device 84.

Bulk component supply device 32 has storage device 458. Storage device 458 is connected to individual control device 452 and stores various information in accordance with instructions from individual control device 452.

(B) Operation of the Component Mounting Machine

Being configured as described above, component mounter 10 mounts components on circuit substrate 12 held by substrate conveyance and holding device 22. Specifically, circuit substrate 12 is conveyed to a work position, and is fixedly held by clamping device 52 at the position. Next, imaging device 26 moves to a position above circuit substrate 12 and images circuit substrate 12. As a result, information on the holding position and the like of circuit substrate 12 can be obtained. Component supply device 30 or bulk component supply device 32 supplies a component at a predetermined supply position. The supplying of components by bulk component supply device 32 will be described in detail later. Either one of work heads 60, 62 moves above the component supply position and holds a component with suction nozzle 66. Subsequently, work head 60, 62 holding the component is moved above imaging device 28, and imaging device 28 images the component held by suction nozzle 66. In this way, information regarding the error of the component holding position can be obtained. Work head 60, 62 holding components then move above circuit substrate 12, correct errors in the holding position of circuit substrate 12, errors in the holding position of the component, and the like, and then mounts the held component on circuit substrate 12.

(C) Operation of the Bulk Component Supply Device

In bulk component supply device 32, lead components 410 are loaded from inlet 97 of component feeder 88 by an operator, and the loaded lead components 410 are supplied by being placed on component receiving member 392 of component carrier 388 by the operation of component supply unit 82 and component delivery device 86.

Specifically, the operator loads lead components 410, as components supplied by component feeder 88 that supplies one among multiple types of components supplied by bulk component supply device 32, from inlet 97 of the upper face of one of five component feeders 88. When this occurs, component support member 150 is moved into the retracted state underneath component feeder 88 by the operation of component support member moving device 152 (refer to FIG. 6). With component support member 150 in the retracted state, component storage container 180 disposed at the front end of component support member 150 is situated at the front of component feeder 88, assuming an orientation (an accommodating orientation) in which the opening of component accommodating container 180 is directed upwards.

Lead components 410 loaded from inlet 97 of component feeder 88 fall on inclined plate 104 of component feeder 88 and roll down to the lower front end of inclined plate 104. Lead components 410 which have rolled down to the lower front end of inclined plate 104 then pile up between the lower end of the front side of inclined plate 104 and the lower rear end of conveyor device 106. By operation of conveyor device 106, conveyor belt 112 of conveyor device 106 rotates counterclockwise in FIG. 6. As a result, lead components 410 piled up between inclined plate 104 and conveyor belt 112 are conveyed diagonally upward by conveyor belt 112.

Lead components 410 conveyed by conveyor belt 112 fall on inclined plate 126 from the upper front end of conveyor device 106. Lead components 410 falling on inclined plate 126 roll over inclined plate 126 toward the rear and fall onto inclined plate 128. Lead components 410 which have fallen on inclined plate 128 roll toward the front and are discharged from discharge port 98 at the front of component feeder 88.

As a result, lead components 410 discharged from discharge port 98 of component feeder 88 are accommodated in component accommodating container 180. Then, when a predetermined amount of lead components 410 from component feeder 88 are discharged, that is, when conveyor device 106 is operated a certain extent, conveyor device 106 stops. Next, component support member 150 moves toward the front from the retracted state by the operation of component support member moving device 152.

Then, container swing device 181 of component return device 92 is activated to operate at a time at which component support member 150 has moved a predetermined amount from the retracted state toward the front, and component accommodating container 180 swings. As a result, the orientation of component accommodating container 180 changes vigorously from the orientation (i.e., the accommodating orientation) in which the opening is directed upward to the orientation (returning orientation) in which the opening is directed toward stage 156. When this occurs, lead components 410 accommodated in component accommodating container 180 are discharged vigorously toward stage 156. As a result, lead components 410 are scattered from component accommodating container 180 onto stage 156.

Figure 13:
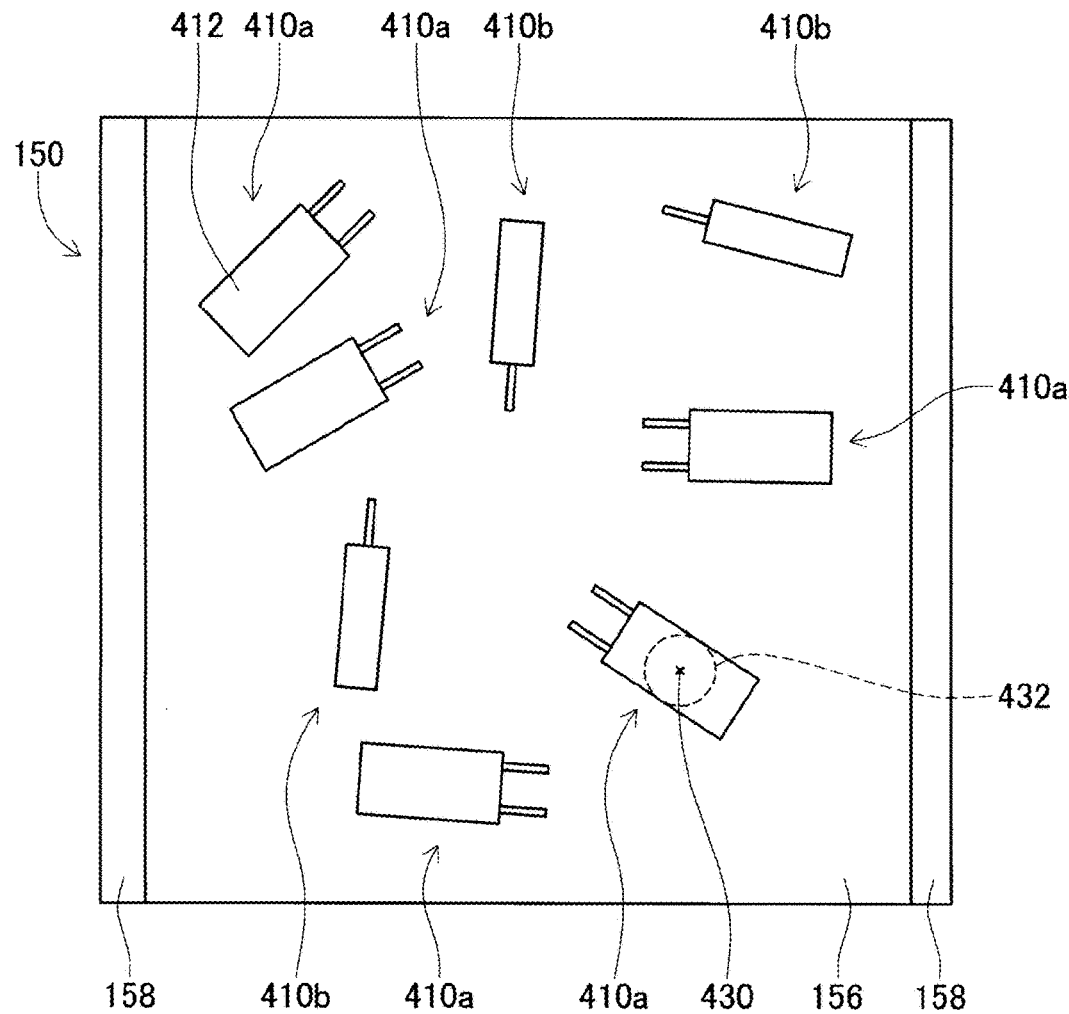
FIG. 13 A view showing a state in which lead components are scattered on a stage.

When lead components 410 are scattered over stage 156 of component support member 150, as shown in FIG. 13, lead components 410 are scattered over stage 156 in generally two orientations. Specifically, the first orientation is an orientation in which lead components 410 are scattered with the faces from which leads 414 project out of are directed laterally and the two leads 414 are generally aligned horizontally. The second orientation is an orientation in which lead components 410 are scattered with the faces from which leads 414 project out are directed laterally and the two leads 414 are generally aligned vertically. When lead components 410 are distinguished by the scattered orientations, the lead components in the first orientation are described as lead components 410a and those in the second orientation are described as lead components 410b.

When lead components 410 are scattered over stage 156 as described above, camera 290 of imaging device 84 moves above component support member 150 by the operation of camera moving device 292. Lead components 410 scattered over stage 156 are then imaged by camera 290. Based on the imaging data captured by camera 290, lead components to be picked up (hereinafter, abbreviated as "pickup target components") are identified by pattern matching.

Figure 14:
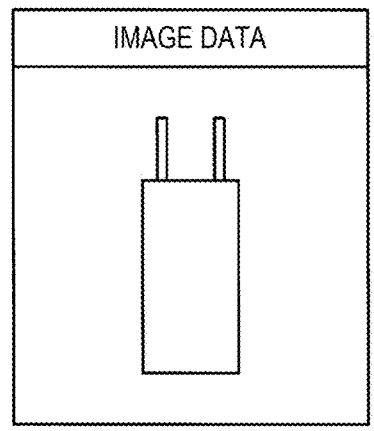
FIG. 14 A view showing a lead component recognized by pattern matching.

Specifically, based on the imaging data of lead components 410 with camera 290, the outlines of lead components 410 are identified, and the shapes of the upper faces of lead components 410, that is, the shapes as viewed from above lead components 410 are calculated. Furthermore, based on the imaging data, the positions of lead components 410 are also calculated. On the other hand, as shown in FIG. 14, storage device 458 stores image data for the shape corresponding to the outline of lead component 410a in the first orientation (hereinafter sometimes referred to as "first orientation component image data").

Then, it is determined whether the shapes of the upper faces of lead components 410 calculated based on the imaging data (hereinafter, sometimes referred to as "imaging component shape") matches the shape of lead components 410 based on the first orientation component image data (hereinafter, sometimes referred to as "first storage component shape"). When it is determined that the imaging component shape matches the first storage component shape, lead components 410 corresponding to the imaging component shape are set as pickup target components.

That is, lead components 410a in the first orientation are set as pickup target components, and lead components 410b in the second orientation are not set as pickup target components. This is because component body 412 of lead components 410b in the second orientation cannot be properly held with suction nozzle 332 due to the small area of the side face of component body 412 facing upward.

Position information for lead components 410 set as pickup target components are then calculated based on the imaging data. Next, based on the calculated position information of pickup target components, component holding head 302 is moved above a pickup target component by the operation of component holding head moving device 300 and the pickup target component is picked up and held by suction nozzle 332. When the pickup target component is being picked up and held by suction nozzle 332, suction nozzle 332 is in the non-pivoted position.

Then, after lead component 410 is held by suction nozzle 332, component holding head 302 moves to a position above component carrier 388. When this occurs, component carrier 388 is moved to the component receiving position by the operation of component carrier moving device 390. Further, as component holding head 302 moves above component carrier 388, suction nozzle 332 is pivoted to the pivoted position. Suction nozzle 332 pivots so that leads 414 of lead component 410 held by suction nozzle 332 in the pivoted position are directed downwards in the vertical direction as a result of the operation of nozzle rotation device 335.

Further, when lead component 410 is held in component holding head 360, chuck 362 of component holding head 360 grips component body 412 of lead component 410 in an orientation in which leads 414 face downward. Therefore, in lead component 410 gripped by chuck 362, even if not pivoted, leads 414 face downward in the vertical direction and are inserted into component receiving recessed section 416 of component receiving member 392. Thus, in component holding head 360, lead component 410 is placed in component receiving recessed section 416 without pivoting the component.

When component holding head 302 is moved to a position above component carrier 388, lead component 410 with leads 414 facing vertically downward is inserted into component receiving recessed section 416 of component receiving member 392. Thus, lead component 410, as shown in FIG. 11, with leads 414 directed vertically downward, is placed in component receiving member 392.

Then, when lead component 410 is placed in component receiving member 392, component carrier 388 moves to the component supply position by the operation of component carrier moving device 390. Component carrier 388 moved to the component supply position supplies lead component 410 to component mounting machine 10 at this position in bulk component supply device 32 because component carrier 388 is positioned within the moving limits of work head 60, 62. In this way, in bulk component supply device 32, lead component 410 is supplied such that leads 414 face downward and the upper face is directed upward, the upper face being the face facing the bottom face of leads 414 to which leads 414 connect. As a result, suction nozzle 66 of work head 60, 62 can properly hold lead component 410.

Further, in bulk component supply device 32, when pickup target component is scattered over stage 156 of component support member 150, the picking up of pickup target components which are scattered is repeated, and the pickup target components which are picked up are placed in component receiving members 392. As a result of component receiving member 392 moving to the component supply position, lead component 410 is supplied.

That is, when lead component 410 held by component holding head 302 is placed in component receiving member 392, component holding head 302 moves to a location above stage 156 again. Component holding head 302 holds lead component 410 from stage 156 and while component holding head is placing held lead component 410 in component receiving member 392, lead components 410 scattered on stage 156 are imaged by camera 290. As this occurs, based on the imaging data created by the imaging, the pickup target components are identified by the pattern matching process described above and the position of the pickup target components identified are calculated. An identified pickup target component is then held by component holding head 302 at a calculated position.

That is, each time lead component 410 is picked up from above stage 156, lead components 410 scattered on stage 156 are imaged by camera 290. Each time imaging by camera 290 is performed, component holding head 302 picks up a pickup target component based on the imaging data created by the new imaging. This is to ensure an adequate holding operation. Specifically, when the holding operation by component holding head 302 is performed at least once, there is a possibility that the component position on the stage will be displaced due to access to stage 156 by component holding head 302. Therefore, each time the holding operation by component holding head 302 is performed, new imaging data is created, and the holding operation by component holding head 302 is performed based on the new imaging data. Thus, even when the component position on the stage is displaced due to access to stage 156 by component holding head 302, for example, contact by suction nozzle 332 with lead component 410 or operational vibration, by executing the holding operation with component holding head 302 based on imaging data after the component position is displaced, it is possible to appropriately ensure the holding operation by component holding head 302.

However, even if imaging by camera 290 is performed for each holding operation by component holding head 302 in this manner, of which operation being ensured, there may be cases where component holding head 302 may fail to hold lead component 410. There are various causes that may lead component holding head 302 to fail in holding lead component 410, such as a dimensional error of the component. Specifically, for example, even though the design thickness of the component is 10 mm, failure to hold the component may occur due to a holding position error or the like in the up-down direction in the case where the thickness of the actual component is 9.9 mm. The same applies to dimensional errors of suction nozzle 332 or damage to suction nozzle 332 or components. In such cases, even if the holding operation is repeated many times for the component, a failure to hold is very likely. For components for which a failure to hold is highly likely, it is a waste of time to perform the holding operation many times.

In view of this, when holding of the component by component holding head 302 fails in bulk component supply device 32, information on the position on stage 156 of the component for which there was a failure in holding (hereinafter, referred to as "positional information") is stored. The component scattered to the position corresponding to the positional information is excluded from being a pickup target component.

Specifically, when component holding head 302 performs a component holding operation, it is determined whether the holding target component is properly held by suction nozzle 332. As described above, if the detected value of pressure sensor 336 reaches the predetermined pressure, it is determined that the holding target component is properly held by suction nozzle 332 and the component held by suction nozzle 332 is placed on component receiving member 392. On the other hand, if the detected value of pressure sensor 336 does not reach the predetermined pressure after the component holding operation by component holding head 302, it is determined that the holding target component is not held by suction nozzle 332. That is, it is determined that the holding of the holding target component has failed.

When it is determined that the holding of the holding target component has failed, the coordinates of the holding position of the component at the time of the holding failure are specified. That is, at the time of the holding operation on the component by component holding head 302, the position of the holding target component is calculated in XY coordinates on the stage, and at the position of the calculated XY coordinates, since the center position of the holding target component (i.e., the center of gravity position if the shape is asymmetric) is held by suction nozzle 332, the position of the XY coordinates of the holding target component is specified as the coordinates of the component holding position when a failure to hold occurs. An area having a radius of 2 mm centered on the holding position is then set as an area in which there was a failure to hold a component (hereinafter, referred to as "component holding failure region").

Specifically, for example, a case will be described in which the holding of lead component 410a in the first orientation positioned at the lower right of stage 156, as shown in FIG. 13, fails in a state in which multiple lead components 410 are scattered on stage 156. The holding position of lead component 410a in the first orientation is a position indicated by cross mark 430, which is the center position of the component, region 432 having a radius of 2 mm centered on cross mark 430 is set as a component holding failure region, and component holding failure region 432 is stored in storage device 458. The basis of using a 2 mm radius is that the smallest component that can be supplied by bulk component supply device 32 is about 4 mm square, and by setting the component holding failure region 432 to a region with radius of 2 mm from its center, even when there is a positional deviation for components for which there was a failure to hold, the center position of components that fail to hold often fall within component holding failure region 432 based on experience, and component holding failure region 432 can be changed from time to time depending on the size and shape of components or holding conditions.

When component holding failure region 432 is stored in storage device 458, the component located inside component holding failure region 432 is excluded from being a pickup target component. That is, based on the imaging data, by executing pattern matching, the pickup target component is identified and the position on the stage of the identified pickup target component is calculated. Subsequently, it is determined whether the position of the pickup target component on the stage is located inside component holding failure region 432. The component located inside component holding failure region 432 is then excluded from being a pickup target component.

That is, for example, on stage 156 shown in FIG. 13, there are five lead components 410a in the first orientation, and these five lead components 410a are identified as pickup target components by pattern matching. However, since the center position of lead component 410a located at the lower right among the five lead components 410a is located inside component holding failure region 432, it is excluded from being a pickup target component. Therefore, on stage 156 shown in FIG. 13, the other four lead components 410a are set as pickup target components, and the four pickup target components are sequentially held by component holding head 302.

In this manner, the position of the component that failed to be held is stored in storage device 458 as component holding failure region 432, and the component located in component holding failure area 432 is excluded from becoming a pickup target component, thereby preventing the holding of a component that has a high probability of not being held properly. As a result, it is possible to cut down on time needed to hold a component which is highly unlikely to be held properly, thereby minimizing wasting of time.

Further, when pickup target components are sequentially picked up from stage 156, lead components 410 excluded from the pickup target components, lead components 410 determined to be impossible to pick up, and lead components 410 determined to be unable to distinguish remain on stage 156. Therefore, such lead components 410 cannot be picked up from the stage. In bulk component supply device 32, lead components 410 remaining on stage 156 are collected in component accommodating container 180. Lead components 410 collected in component container 180 are then scattered over stage 156 again, and the orientations of lead components 410 are changed, whereby picking up of lead components 410 from stage 156 is resumed.

Specifically, when all pickup target components on stage 156 are picked up, component support member 150 moves towards the retracted position underneath component feeder 88 as a result of operation of component support member moving device 152. That is, component support member 150 moves from the exposed state (see FIG. 5) to the retracted state (see FIG. 6). When this occurs, component accommodating container 180 disposed at the front end of component support member 150 assumes an orientation in which the opening is directed upward. When component support member 150 moves from the exposed state towards the retracted state, lead components 410 on stage 156 of component support member 150 are held back by a front end portion of inclined plate 128 of component feeder 88.

Figure 6:
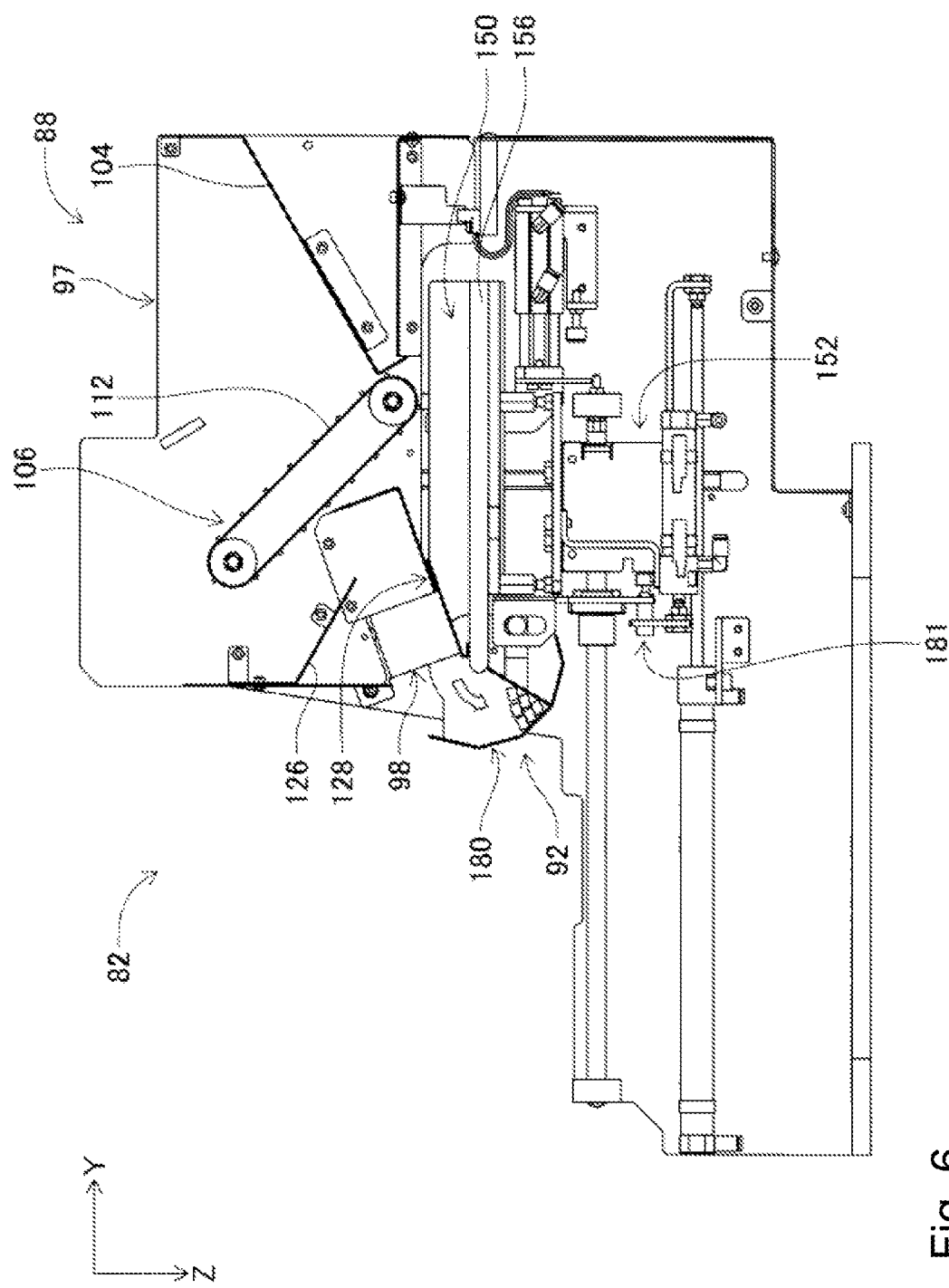
FIG. 6 A see-through view showing the component supply unit.

Further, as shown in FIG. 6, when component support member 150 moves to the retracted state, lead components 410 on stage 156 are scraped off into component accommodating container 180. As a result, lead components 410 on stage 156 are collected in component accommodating container 180. Thus, when lead components 410 from stage 156 are collected in component accommodating container 180, the number of lead components 410 picked up in addition to the number of lead components 410 collected are replenished from component feeder 88, and the sum of lead components 410 is replenished on stage 156 from component accommodating container 180 on stage 156.

More specifically, when the collection of lead components 410 in component accommodating container 180 is completed, component support member 150 is in the retracted state, as shown in FIG. 6. Due to this, component support member 150 moves from the retracted state to the front as a result of operation of component support member moving device 152. Then, container swing device 181 of component return device 92 is activated to operate at a time at which component support member 150 has moved a predetermined amount from the retracted state toward the front, and component accommodating container 180 swings. As a result, the orientation of component accommodating container 180 changes vigorously from the orientation (i.e., the accommodating orientation) in which the opening is directed upward to the orientation (returning orientation) in which the opening is directed toward stage 156.

When this occurs, lead components 410 accommodated in component accommodating container 180 are discharged vigorously toward stage 156. As a result, lead components 410 are scattered from component accommodating container 180 onto stage 156. That is, lead components 410 recovered into component storage container 180 are replenished onto stage 156. Thus, the orientations of the replenished lead components 410 are changed, and pickup target lead component 410 are picked up from stage 156 again.

When lead components 410 on stage 156 are collected in component accommodating container 180 and lead components 410 collected in component accommodating container 180 are scattered over stage 156 again, component holding failure region 432 stored in storage device 458 is deleted. This is because the collecting of lead components 410 into component accommodating container 180 and re-scattering to stage 156 causes components that failed to hold to move out of component holding failure region 432. Therefore, after lead components 410 are collected in component accommodating container 180 and re-scattered on stage 156, the pickup target components are specified and picked up according to the above-described procedure. When component holding fails at this time, component holding failure region 432 is set based on the holding position of the component (i.e., the center position of the component), and the component having a center position in component holding failure region 432 is excluded from being a pickup target component.

Bulk component supply device 32 is an example of a component supply system. Stage 156 is an example of a stage. Camera 290 is an example of an imaging device. Suction nozzle 332 is an example of a holding tool. Individual control device 452 is an example of a control device. Storage device 458 is an example of a storage device.

It should be noted that the present disclosure is not limited to the above-mentioned embodiments, and can be implemented in various modes in which various modifications and improvements are made based on the knowledge of a person skilled in the art. Specifically, for example, in the above embodiment, each time the holding operation by component holding head 302 is performed, stage 156 is imaged by camera 290, and each time imaging is performed, the holding operation of the component is performed by component holding head 302 based on the imaging data created by the new imaging. On the other hand, the holding operation by component holding head 302 may be executed multiple times based on one piece of imaging data. Specifically, for example, with the number of executions of holding operation of component by component holding head 302 set to two or more times, each time the operation is executed, stage 156 is imaged by camera 290, and the holding operation of component by component holding head 302 may be executed the above set number of times based on one piece of imaging data. That is, one piece of imaging data may be used a set number of times in the holding operation by component holding head 302. In addition, the time at which imaging is executed is not limited to immediately after lead components 410 stored in component accommodating container 180 are scattered on stage 156 and may be any time as long as it is some time after scattering and before the component is picked up. Thus, it is possible to reduce the number of times of imaging by camera 290.

Further, component holding head 302 having only one suction nozzle 332 places lead components 410 one by one from stage 156 to component receiving recessed section 416, component holding head 360 having multiple chucks 362 can sequentially place multiple lead components 410 from stage 156 in component receiving recessed sections 416. That is, component holding head 360 moves from above stage 156 to above component receiving member 392 after gripping eight lead components 410 with eight chucks 362, and all of those eight lead components 410 are sequentially placed so as to fill all component receiving recessed sections 416. As a result, lead components 410 on stage 156 can be efficiently placed in component receiving recesses 416.

Further, it is easy change suction nozzle 332, which is a holding tool, to a gripping chuck and use the gripping chuck as a holding tool.

Additionally, in the embodiment described above, while the disclosure is applied to lead components 410, the disclosure can be applied to various types of components. Specifically, the present disclosure can be applied to, for example, solar cell components, power module components, electronic circuit components having no leads, and the like.

REFERENCE SIGNS LIST

32: Bulk component supply device (component supply system), 156: Stage, 290: Camera (imaging device), 332: Suction nozzle (holding tool), 452: Individual control device

The invention claimed is:
1. A component mounting system comprising:
a stage configured to scatter components;
a holding tool including a suction nozzle configured to move over the stage and hold components that are on the stage;

a storage device including a memory configured to store positional information of components on the stage; and a control device including a processor configured to control operation of the holding tool by
- determining whether a holding target component is properly held by the holding tool,
- when it is determined that the holding target component is not properly held by the holding tool, obtaining the positional information of the holding target component and storing the obtained positional information in the storage device,
- setting a component holding failure region on the stage based on the obtained positional information, and
- excluding the components on the stage located inside the component holding failure region from being a pickup target component.

2. The component mounting system of claim 1, wherein the component mounting system further comprises an imaging device including a camera configured to image components on the stage, and the control device controls the operation of the holding tool based on imaging data from the imaging device.

3. The component mounting system of claim 2,
wherein the imaging device images components on the stage each time a holding operation on a component is executed by the holding tool, and
wherein the control device controls the operation of the holding tool each time imaging is performed by the imaging device based on newly created imaging data.

4. The component mounting system of claim 2, wherein the control device controls the operation of the holding tool so that the holding operation on components is executed multiple times based on one piece of imaging data from the imaging device.

5. The component mounting system of claim 4, wherein the imaging device images components on the stage a set number of times, an imaging performed each time the holding operation of a component is performed by the holding tool; and the control device controls the operation of the holding tool such that the holding operation of the component by the holding tool is performed a set number of times based on one piece of imaging data from the imaging device.

6. The component mounting system of claim 1, wherein the component mounting system comprises a multiple of the holding tools, and the control device controls the operation of the multiple holding tools so as to move the multiple holding tools from the stage after components are held by all of the multiple holding tools.

7. The component mounting system of claim 1, wherein the component mounting system further comprises an increasing mechanism including a component accommodating container configured to increase the number of components scattered on the stage when the number of holding target components on the stage has decreased as a result of the holding tool holding components from the stage.

8. A component holding method for holding components from a stage configured to scatter components using a holding tool configured to move over the stage, the component holding method comprising:
- determining whether a holding target component is properly held by the holding tool;
- when it is determined that the holding target component is not properly held by the holding tool, obtaining the positional information of the holding target component;
- storing the obtained positional information;
- setting a component holding failure region on the stage based on the obtained positional information; and
- excluding the components on the stage located inside the component holding failure region from being a pickup target component.

* * * * *